US011754458B2

(12) United States Patent
Larsen et al.

(10) Patent No.: US 11,754,458 B2
(45) Date of Patent: Sep. 12, 2023

(54) ANALYTICAL TOILET WITH A PRESSURE SENSOR MOUNTING FIXTURE

(71) Applicant: Medic, Inc., Provo, UT (US)

(72) Inventors: Joshua Larsen, Spanish Fork, UT (US); John W. Christiansen, American Fork, UT (US); K. Jeffrey Campbell, Spanish Fork, UT (US)

(73) Assignee: Hall Labs LLC, Provo, UT (US)

( * ) Notice: Subject to any disclaimer, the term of this patent is extended or adjusted under 35 U.S.C. 154(b) by 0 days.

(21) Appl. No.: 17/661,186

(22) Filed: Apr. 28, 2022

(65) Prior Publication Data

US 2022/0349767 A1 Nov. 3, 2022

Related U.S. Application Data

(60) Provisional application No. 63/181,077, filed on Apr. 28, 2021.

(51) Int. Cl.
| G01L 19/00 | (2006.01) |
| G01L 19/14 | (2006.01) |
| E03D 11/13 | (2006.01) |
| B81B 7/02  | (2006.01) |

(52) U.S. Cl.
CPC .............. G01L 19/147 (2013.01); B81B 7/02 (2013.01); E03D 11/13 (2013.01); G01L 19/0023 (2013.01); *B81B 2201/0264* (2013.01)

(58) Field of Classification Search
None
See application file for complete search history.

(56) References Cited

U.S. PATENT DOCUMENTS

| 2018/0168556 A1* | 6/2018 | Hall | ..................... G01J 3/0205 |
| 2020/0393284 A1* | 12/2020 | Hall | ..................... E03D 11/13 |
| 2020/0394781 A1* | 12/2020 | Hall | ..................... G06N 3/02 |

* cited by examiner

*Primary Examiner* — Lisa M Caputo
*Assistant Examiner* — Nigel H Plumb

(57) ABSTRACT

An analytical toilet, comprising: a bowl for receiving excreta supported by a base; a pressure sensor mounting fixture, comprising: a chamber with an outlet, wherein the chamber is in fluid communication with the contents of the bowl through the outlet, a pressure sensor cavity above the chamber having an inlet in fluid communication with the chamber such that an air bubble is maintained in the pressure sensor cavity, and a pressure sensor adapted to measure the pressure in the pressure sensor cavity is disclosed. The disclosed toilet is able to accurately measure changes to the contents of the bowl by measuring changes to the pressure in the bowl using a pressure sensor that is kept separated from the toilet contents.

20 Claims, 4 Drawing Sheets

ANALYTICAL TOILET WITH A PRESSURE SENSOR MOUNTING FIXTURE

CROSS-REFERENCE TO RELATED APPLICATION

This application claims the benefit under 35 U.S.C. § 119(e) of U.S. Provisional Patent Application No. 63/181,077 titled "Analytical Toilet with a Dry Pressure Sensor Mounting Fixture" filed on 28 Apr. 2021, which disclosure is incorporated herein by reference in its entirety.

TECHNICAL FIELD

The present disclosure relates to analytical toilets. More particularly, it relates to analytical toilets equipped to provide health and wellness information to the user.

BACKGROUND

The ability to track an individual's health and wellness is currently limited due to the lack of available data related to personal health. Many diagnostic tools are based on examination and testing of excreta, but the high cost of frequent doctor's visits and/or scans make these options available only on a very limited and infrequent basis. Thus, they are not widely available to people interested in tracking their own personal wellbeing.

Toilets present a fertile environment for locating a variety of useful sensors to detect, analyze, and track trends for multiple health conditions. Locating sensors in such a location allows for passive observation and tracking on a regular basis of daily visits without the necessity of visiting a medical clinic for collection of samples and data. Monitoring trends over time of health conditions supports continual wellness monitoring and maintenance rather than waiting for symptoms to appear and become severe enough to motivate a person to seek care. At that point, preventative care may be eliminated as an option leaving only more intrusive and potentially less effective curative treatments. An ounce of prevention is worth a pound of cure.

Just a few examples of smart toilets and other bathroom devices can be seen in the following U.S. Patents and Published Applications: U.S. Pat. No. 9,867,513 entitled "Medical Toilet With User Authentication"; U.S. Pat. No. 10,123,784 entitled "In Situ Specimen Collection Receptacle In A Toilet And Being In Communication With A Spectral Analyzer"; U.S. Pat. No. 10,273,674 entitled "Toilet Bowl For Separating Fecal Matter And Urine For Collection And Analysis"; US 2016/0000378 entitled "Human Health Property Monitoring System"; US 2018/0020984 entitled "Method Of Monitoring Health While Using A Toilet"; US 2018/0055488 entitled "Toilet Volatile Organic Compound Analysis System For Urine"; US 2018/0078191 entitled "Medical Toilet For Collecting And Analyzing Multiple Metrics"; US 2018/0140284 entitled "Medical Toilet With User Customized Health Metric Validation System"; and US 2018/0165417 entitled "Bathroom Telemedicine Station." The disclosures of all these patents and applications are incorporated by reference in their entireties.

SUMMARY

In a first aspect, the disclosure provides an analytical toilet, having a bowl for receiving excreta supported by a base. The toilet also includes a pressure sensor mounting fixture, which has: a chamber with an outlet. The chamber is in fluid communication with the contents of the bowl through the outlet. The pressure sensor mounting fixture also has a pressure sensor cavity above the chamber having an inlet in fluid communication with the chamber such that an air bubble is maintained in the pressure sensor cavity. A pressure sensor is included that is adapted to measure the pressure in the pressure sensor cavity.

In a second aspect, the disclosure provides a system for measuring changes in the volume in a toilet bowl. The system includes a pressure sensor mounting fixture, having a chamber with an outlet. The chamber is in fluid communication with the contents of the bowl through the outlet. The pressure sensor mounting fixture also has a pressure sensor cavity above the chamber having an inlet in fluid communication with the chamber such that an air bubble is maintained in the pressure sensor cavity. A pressure sensor is included that is adapted to measure the pressure in the pressure sensor cavity.

Further aspects and embodiments are provided in the foregoing drawings, detailed description, and claims.

BRIEF DESCRIPTION OF THE DRAWINGS

The following drawings are provided to illustrate certain embodiments described herein. The drawings are merely illustrative and are not intended to limit the scope of claimed inventions and are not intended to show every potential feature or embodiment of the claimed inventions. The drawings are not necessarily drawn to scale; in some instances, certain elements of the drawing may be enlarged with respect to other elements of the drawing for purposes of illustration.

DETAILED DESCRIPTION

Figure 1:
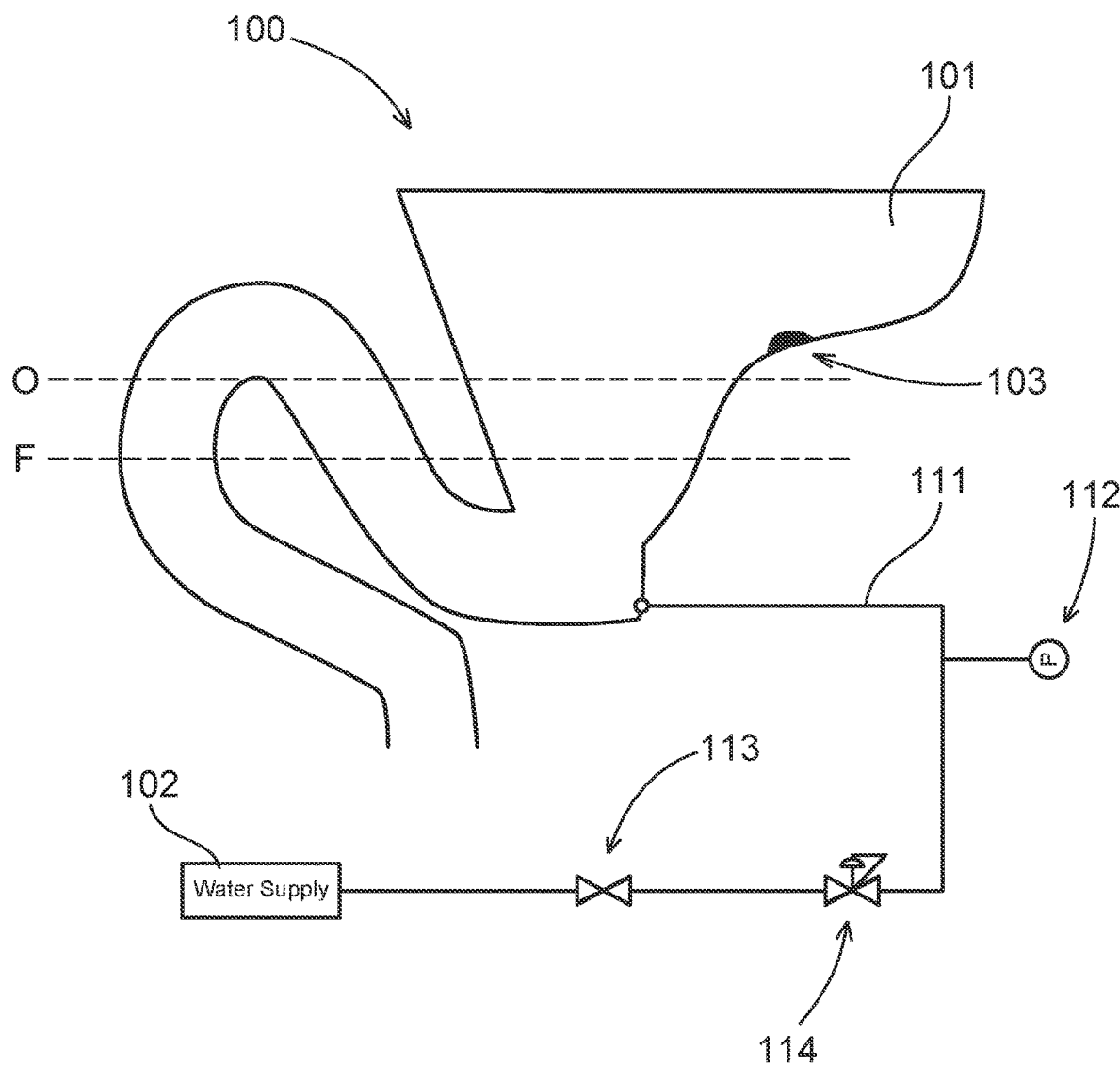
FIG. 1 is a schematic view of a toilet according to the present disclosure.

The following description recites various aspects and embodiments of the inventions disclosed herein. No particular embodiment is intended to define the scope of the invention. Rather, the embodiments provide non-limiting examples of various compositions, and methods that are included within the scope of the claimed inventions. The description is to be read from the perspective of one of ordinary skill in the art. Therefore, information that is well known to the ordinarily skilled artisan is not necessarily included.

Definitions

The following terms and phrases have the meanings indicated below, unless otherwise provided herein. This disclosure may employ other terms and phrases not expressly defined herein. Such other terms and phrases shall have the meanings that they would possess within the context of this disclosure to those of ordinary skill in the art. In some instances, a term or phrase may be defined in the singular or plural. In such instances, it is understood that any term in the singular may include its plural counterpart and vice versa, unless expressly indicated to the contrary.

As used herein, the singular forms "a," "an," and "the" include plural referents unless the context clearly dictates otherwise. For example, reference to "a substituent" encompasses a single substituent as well as two or more substituents, and the like.

As used herein, "for example," "for instance," "such as," or "including" are meant to introduce examples that further clarify more general subject matter. Unless otherwise expressly indicated, such examples are provided only as an aid for understanding embodiments illustrated in the present disclosure and are not meant to be limiting in any fashion. Nor do these phrases indicate any kind of preference for the disclosed embodiment.

As used herein, "toilet" is meant to refer to any device or system for receiving human excreta, including urinals.

As used herein, the term "bowl" refers to the portion of a toilet that is designed to receive excreta.

As used herein, the term "base" refers to the portion of the toilet below and around the bowl supporting it.

As used herein, the term "user" refers to any individual who interacts with the toilet and deposits excreta therein.

As used herein, the term "excreta" refers to any substance released from the body including urine, feces, menstrual discharge, and anything contained or excreted therewith.

As used herein, the term "excretion profile" is meant to refer collectively to the rate of excretion at any moment in time of an excretion event and the total volume or mass of excreta as a function of time during an excretion event. The terms "defecation profile" and "urination profile" refer more specifically to the separate measurement of excreta from the anus and urethra, respectively.

As used herein, the term "sensor" is meant to refer to any device for detecting and/or measuring a property of a person or substance regardless of how that property is detected or measured, including the absence of a target molecule or characteristic. Sensors may use a variety of technologies including, but not limited to, MOS (metal oxide semiconductor), CMOS (complementary metal oxide semiconductor), CCD (charge-coupled device), FET (field-effect transistors), nano-FET, MOSFET (metal oxide semiconductor field-effect transistors), spectrometers, volume measurement devices, weight sensors, temperature gauges, chromatographs, mass spectrometers, IR (infrared) detector, near IR detector, visible light detectors, and electrodes, microphones, load cells, pressure gauges, PPG (photoplethysmogram), thermometers (including IR and thermocouples), rheometers, durometers, pH detectors, scent detectors gas, and analyzers.

Exemplary Embodiments

The present disclosure relates to analytical toilets designed to measure health and wellness indicators. More particularly, the present disclosure relates to a toilet that uses a pressure sensor to measure changes in toilet content and thereby gather data on excretion events such as flow rate and volume over time during an excretion event, thus providing an excretion profile. The toilet environment presents many obstacles to making such measurements.

The present disclosure preferably uses low-cost pressure sensors that are not rated for direct contact with water or only for contact with clean water. It also preferably uses sensors that are not rated for water supply pressures. It also preferably is self-cleaning to prevent build-up of mineral and solid particulate sediment.

In a preferred embodiment, the disclosed pressure sensor mounting fixture is in-line with a water supply while keeping the sensor from directly contacting the water at any time. The toilet with the sensor can be shipped dry and filled after installation without any special consideration for the sensor. The geometry of the mounting fixture consists of an inverted "dry well" containing an air bubble, which allows the sensor to be placed below the elevation of the toilet fill level without water contacting the sensor making it easier to locate the sensor within the toilet frame.

Now referring to FIG. 1, a schematic view of the toilet system 100 is shown. The valve/tube assembly allows for a controlled bowl 101 fill through the flow tube/mounting fixture, which also helps flush out any waste in the line 111, preferably during the toilet flush cycle. In exemplary embodiments, a water supply 102 (e.g., wall pressure water) is in communication with the pressure sensor 112 and bowl 101 with an intervening valve 113 and pressure regulator 114. The valve 113 is used to control when water from the supply 102 is allowed to flow into the line 111. The pressure regulator 114 ensures that the pressure in the line 111 is not allowed to exceed the pressure rating for the pressure sensor 112, In some optional embodiments, a valve (not shown) may be placed in the line between the bowl 101 and the pressure sensor 112.

In various exemplary embodiments, the outlet from the line 111 to the bowl 101 is placed at or near the bottom of the bowl. In less preferred embodiments, the outlet is placed at least lower than the minimum fill level, an example of which is shown as line F. In various exemplary embodiments, a screen, filter, semipermeable membrane, or the like (not shown) is placed between the bowl 101 and the sensor mounting fixture to allow fluids, but not solids, to flow or diffuse into the line to the sensor.

In an exemplary embodiment, the arrangement of valves and regulators protects the pressure sensor against exposure to pressures greater than the rated proof pressure of the pressure sensor. Preferably, the pressure is limited to appreciably less than this pressure. In a preferred embodiment, the maximum pressure to which the sensor may be exposed is 1 psi.

In some embodiments, the toilet may include a spectrometer slit 103 for collecting and examining urine, placed above exemplary minimum fill level F and preferably above overflow line O. An exemplary toilet with such a slit is disclosed in U.S. patent application Ser. No. 15/383,187 entitled "Capillary Slit Urine Sampling System" filed 19 Dec. 2016, the entire disclosure of which is referenced herein in its entirety. In such toilets, the flow of clean water through the mounting fixture to refill the bowl passes through the slit to rinse and clean it.

In an exemplary embodiment, the intended operational sequence of this tubing system (starting with a flush) is as follows:

1. Toilet flush initiates and completes, evacuating the bowl. The valve between the water supply and pressure sensor is opened to flush out any waster in the line during and possibly after the flush. The liquid level in the bowl is at its lowest point after the flush.
2. A water supply and valve (not shown) supply water to the bowl for a timed period.
3. The pressure sensor reads the pressure which is used to determine the liquid level.
4. Steps 2 and 3 repeat as necessary to get to a "coarse" liquid level setpoint in the bowl.
5. Water is released into the slit until the desired level is reached. This also serves as a spectrometer slit rinse.

6. An air pump (not shown) blows air into the slit to dry the slit.

Figure 2:
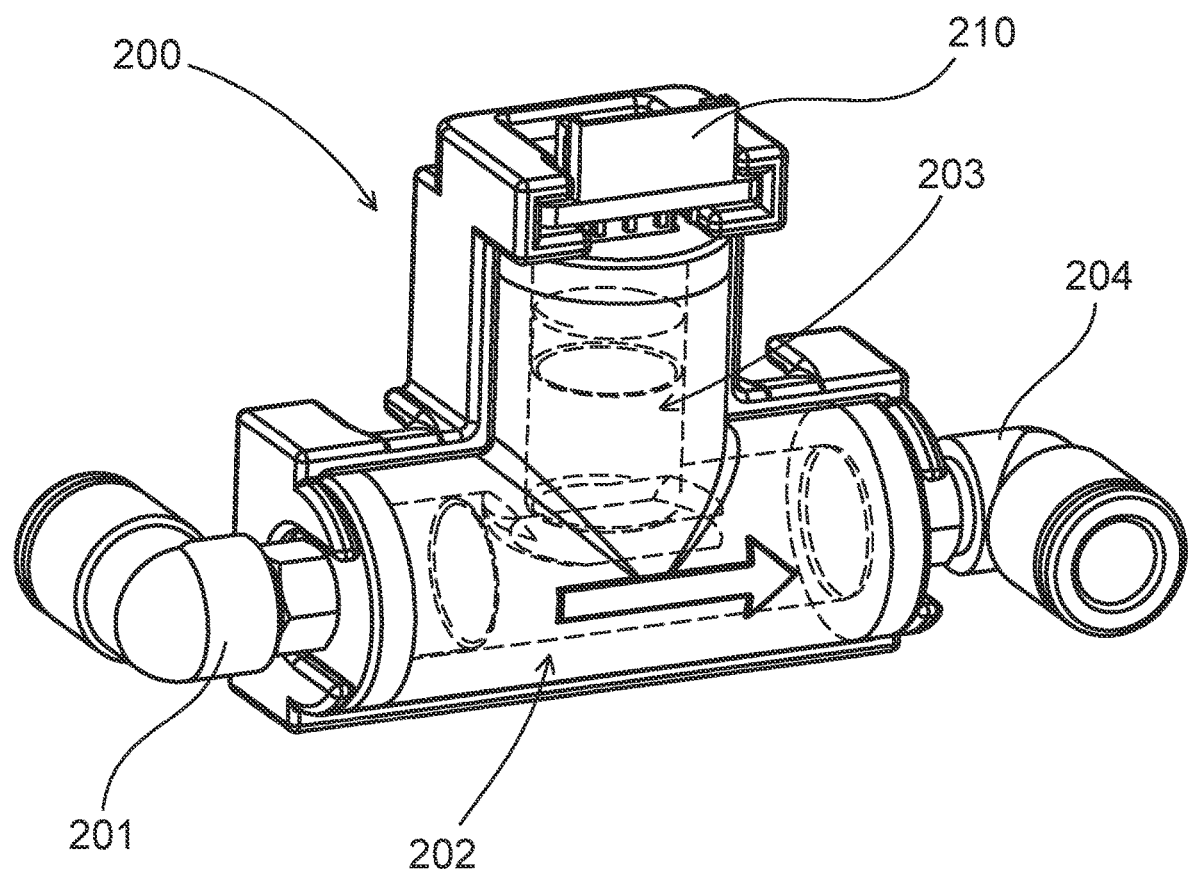
FIG. 2 is an isometric view of a dry pressure sensor mounting according to the present disclosure.
Figure 3:
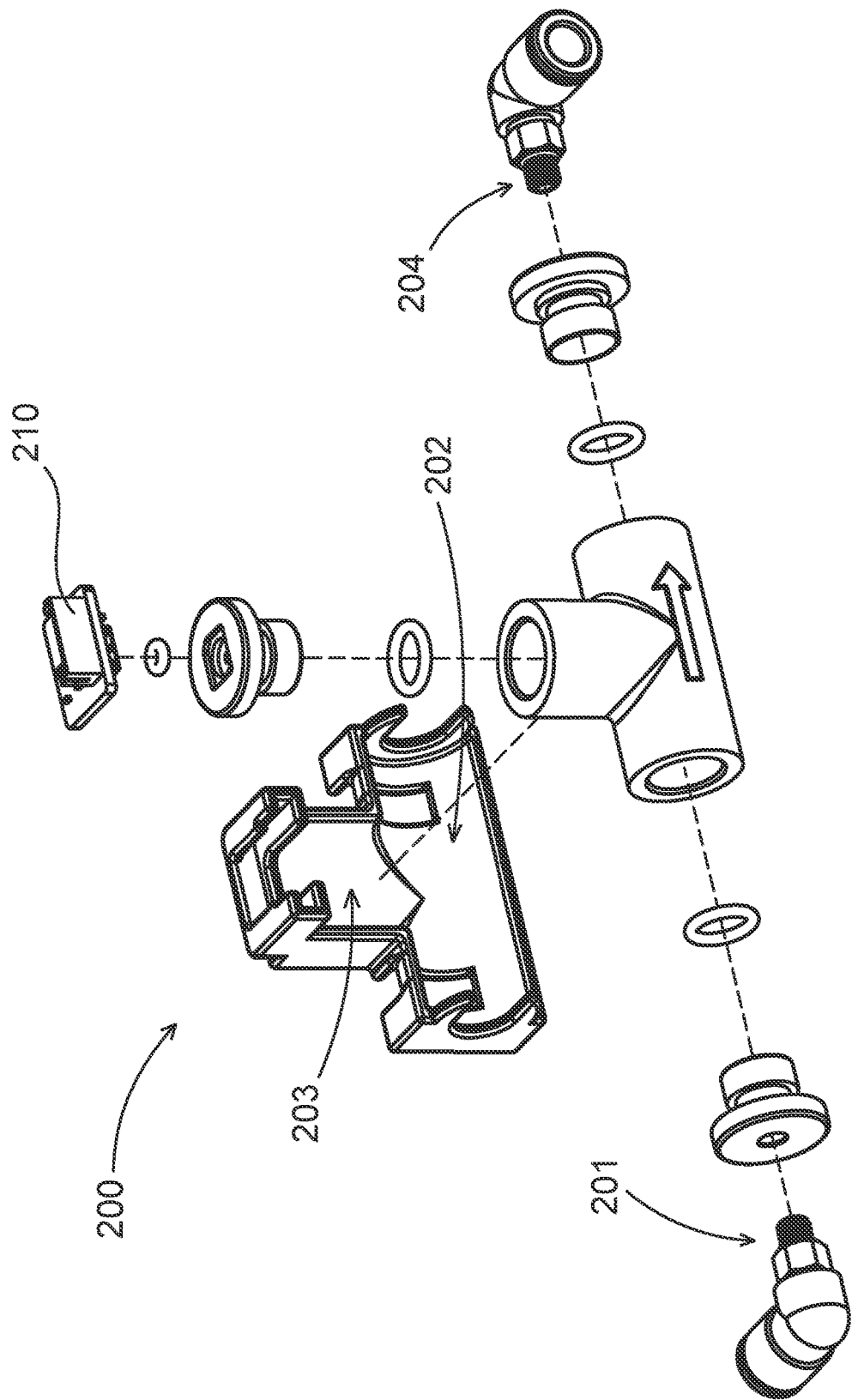
FIG. 3 is an exploded isometric view of the mounting of FIG. 2.

Now referring to FIGS. 2-3, an exemplary embodiment of a pressure sensor mounting fixture 200 is shown. During flush and/or refill, fluid flows (left to right in this illustration) through a flow line inlet 201 into a chamber 202 in the fixture 200 and exits the chamber 202 through outlet 204. A pressure sensor cavity 203 is placed above the chamber 202 in fluid communication with the chamber 202. Air pressure in the cavity prevents the flow of liquid into the cavity. A pressure sensor 210 is located above the cavity 203 to measure pressure changes in the cavity 203. As shown in FIG. 1, the chamber 202 is in fluid communication with the bowl such that changes in the fluid level in the bowl cause changes in the air pressure in the cavity 203.

In various exemplary embodiments, the pressure sensor 210 may be any of a variety of sensors rated for wet or dry environments in the appropriate pressure range. In preferred embodiments, the pressure sensor 210 is a microelectromechanical systems (MEMS) pressure sensor. The preferred MEMS sensors are sensitive across a small range that includes the range of full to overflowing toilet bowl water pressures providing very precise measurements. They also have a linear response to pressure changes making them easier to calibrate and operate.

In a preferred embodiment, the mounting fixture 200 is upstream from the contaminated water (in the bowl). Backflow of particulates is minimized by the placement of the inlet to the pressure cavity 203 at the top of the mounting fixture chamber 202. In some embodiments, the sensor cavity 203 includes an inlet (not shown) for clean water to force any liquids the cavity 203. In a preferred embodiment, particulates are blocked from entering the cavity 203 by a screen, filter, semipermeable membrane, or the like (not shown) across the outlet 204 from the chamber 202. In other embodiments, a screen may be placed between the mounting and the bowl (e.g., at the outlet from the line to the bowl or in the line).

In a preferred embodiment, the cavity diameter is sufficiently large that any water droplets that enter or form will drain back into the chamber 202 and not obstruct the cavity 203. A droplet forming across the cavity could cause delayed response in the pressure sensor readings to changes in bowl contents. The minimum sensor cavity diameter is a function of the capillary length of the water/air interface. In order to allow proper drainage, a minimum diameter of 5.40 mm is preferred. A larger diameter may be used based on other considerations, such as the dimensions of the pressure sensor and manufacturability. A diameter of about 11.1 mm accommodates these needs.

In a preferred embodiment, the chamber 202 is larger in diameter than the outlet 204 from it from the bowl 100. It is believed that a ratio of the chamber diameter to outlet diameter of about 1.5 is appropriate. The increased diameter of the chamber 202 around the sensor cavity inlet reduces the velocity of the liquid to counteract any Venturi effect from perturbing the pressure in the chamber 202.

In a preferred embodiment, one or more valves control flow of water through the mounting fixture. Such valves may be part of the mounting or separate therefrom. They may be located upstream and/or downstream of the mounting fixture. The valves control flow and allow the same tubing to operate at different pressures at different stages of the sequence. They also make the system self-flushing and self-cleaning on every toilet flush cycle.

Figure 4:
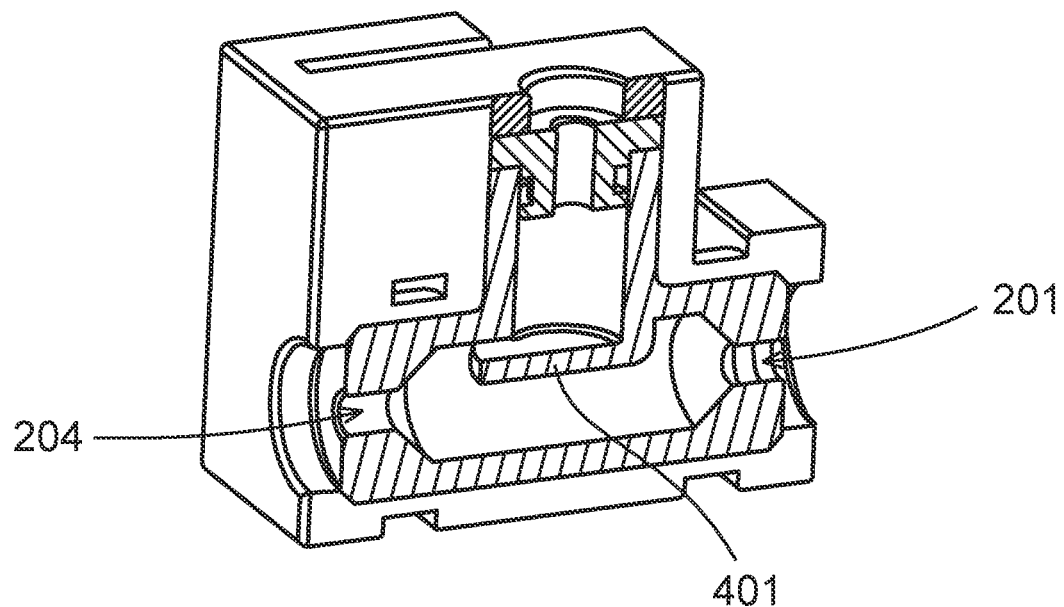
FIG. 4 is an isometric cross-sectional view of the mounting of FIG. 2.
Figure 5:
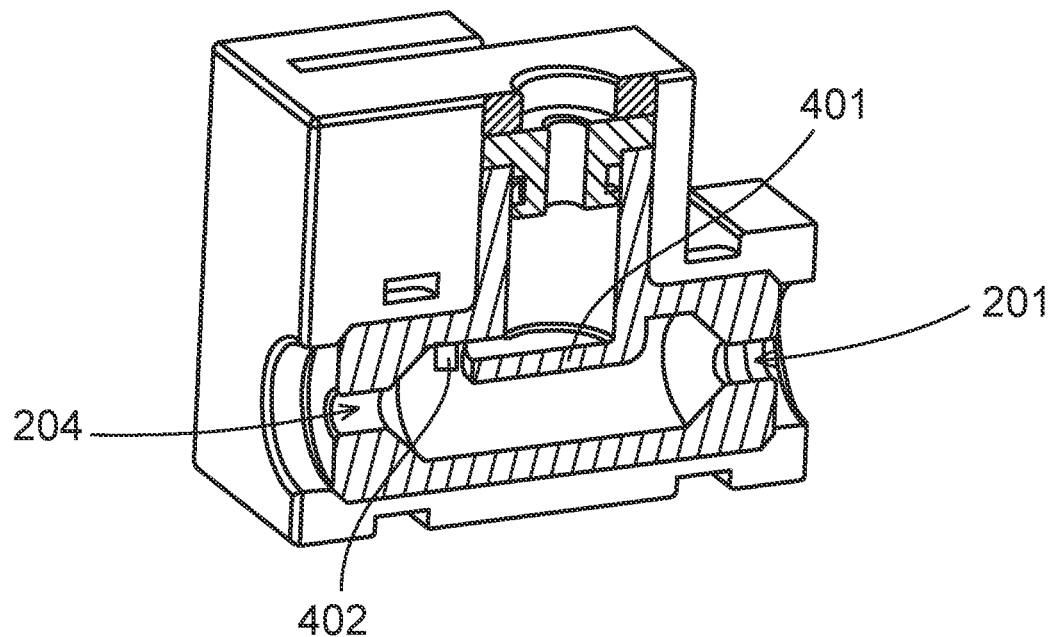
FIG. 5 is an isometric cross-sectional view of the mounting of FIG. 2.

Now referring to FIGS. 4-5, additional protrusions in the vicinity of the sensor cavity inlet may be used to disrupt the formation of eddy flow into the sensor chamber. Unlike FIGS. 2-3, flow through the fixture 200 is from right to left. In various exemplary embodiments, a barrier 401 partially blocks the interface between the chamber 202 and the sensor cavity 203 to prevent mixing of liquid and air that could cause the air to become entrained and removed from the sensor cavity 203. In FIG. 4, a barrier 401 is placed below the sensor tube inlet with a gap on at least one side. In preferred embodiments, the gap is open toward the inlet 201 end. In some alternative embodiments, the gap may be open toward the inlet 201 and/or one or both sides of the tube. In the embodiment of FIG. 5, an eddy blocker 402 extends downward just upstream from the barrier 401 to inhibit flow pushing into the sensor cavity 203.

In various exemplary embodiments, the toilet system includes a digital processor operating valves, sensors, and communication component controlling the system, collecting and/or processing data, and transmitting the data to other devices or systems.

All patents, published patent applications, and other publications referred to herein are incorporated herein by reference. The invention has been described with reference to various specific and preferred embodiments and techniques. Nevertheless, it is understood that many variations and modifications may be made while remaining within the spirit and scope of the invention.

What is claimed is:

1. An analytical toilet, comprising:
   a bowl for receiving excreta supported by a base;
   a pressure sensor mounting fixture, comprising:
      a chamber with an outlet,
         wherein the chamber is in fluid communication with the contents of the bowl through the outlet,
      a pressure sensor cavity above the chamber having an inlet in fluid communication with the chamber such that an air bubble is maintained in the pressure sensor cavity, and
      a pressure sensor above the pressure sensor cavity adapted to measure the pressure in the pressure sensor cavity.

2. The analytical toilet of claim 1, wherein the pressure sensor cavity is sized such that droplets that form in it will drain into the chamber.

3. The analytical toilet of claim 2, wherein the diameter of the pressure sensor cavity is at least 5.40 mm.

4. The analytical toilet of claim 2 wherein the diameter of the pressure sensor cavity is about 11.1 mm.

5. The analytical toilet of claim 1, wherein the pressure sensor comprises a microelectromechanical system (MEMS) pressure sensor.

6. The analytical toilet of claim 1, wherein the diameter of the chamber is greater than the diameter of the chamber outlet.

7. The analytical toilet of claim 6, wherein the ratio of the diameter of the chamber to the diameter of the chamber outlet is about 1.5.

8. The analytical toilet of claim 1, further comprising a fill screen across the pressure sensor cavity inlet.

9. The analytical toilet of claim 1, wherein the chamber further comprises at least one eddy blocker or barrier below the sensor cavity inlet.

10. The analytical toilet of claim 9, wherein the at least one eddy blocker comprises at least one protrusion in the vicinity of the pressure sensor cavity inlet.

11. A system for measuring changes in the volume in a toilet bowl, comprising:
   a pressure sensor mounting fixture, comprising:

a chamber with an outlet, wherein the chamber is in fluid communication with the contents of the bowl through the outlet, a pressure sensor cavity above the chamber having an inlet in fluid communication with the chamber such that an air bubble is maintained in the pressure sensor cavity, and a pressure sensor above the pressure sensor cavity adapted to measure the pressure in the pressure sensor cavity.

12. The system of claim 11, wherein the pressure sensor cavity is sized such that droplets that form in it will drain into the chamber.

13. The system of claim 12, wherein the diameter of the pressure sensor cavity is at least 5.40 mm.

14. The system of claim 12, wherein the diameter of the pressure sensor cavity is about 11.1 mm.

15. The system of claim 11, wherein the pressure sensor comprises a microelectromechanical system (MEMS) pressure sensor.

16. The system of claim 11, wherein the diameter of the chamber is greater than the diameter of the chamber outlet.

17. System of claim 16, wherein the ratio of the diameter of the chamber to the diameter of the chamber outlet is about 1.5.

18. The system of claim 11, further comprising a fill screen across the pressure sensor cavity inlet.

19. The system of claim 11, wherein the chamber further comprises at least one eddy blocker or barrier below the sensor cavity inlet.

20. The system of claim 19, wherein the at least one eddy blocker comprises at least one protrusion in the vicinity of the pressure sensor cavity inlet.

* * * * *